(12) United States Patent
Mikhemar et al.

(10) Patent No.: US 8,830,881 B2
(45) Date of Patent: Sep. 9, 2014

(54) WIDE BAND ELECTRICAL BALANCE DUPLEXER WITH BALANCED BRIDGE CIRCUIT

(71) Applicant: Broadcom Corporation, Irvine, CA (US)

(72) Inventors: Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 130 days.

(21) Appl. No.: 13/715,893

(22) Filed: Dec. 14, 2012

(65) Prior Publication Data

US 2014/0169235 A1    Jun. 19, 2014

(51) Int. Cl.
*H04L 5/14* (2006.01)
*H04B 1/44* (2006.01)
*H01Q 1/50* (2006.01)

(52) U.S. Cl.
CPC .. *H01Q 1/50* (2013.01); *H04L 5/14* (2013.01); *H04B 1/44* (2013.01)
USPC .............. 370/278; 370/277; 375/219; 455/73

(58) Field of Classification Search
CPC .............. H04B 1/44; H04B 1/52; H04B 1/40; H04B 1/38; H04B 1/50; H04L 5/14; H04L 5/1461; H04Q 1/50
USPC ........ 370/200–278; 375/219, 222; 455/73, 78
See application file for complete search history.

(56) References Cited

U.S. PATENT DOCUMENTS

| | | | |
|---|---|---|---|
| 2,287,794 A * | 6/1942 | Gunn | 73/862.28 |
| 8,514,917 B1 * | 8/2013 | Heidari et al. | 375/222 |
| 2005/0026571 A1 * | 2/2005 | Yang et al. | 455/78 |
| 2013/0083703 A1 * | 4/2013 | Granger-Jones et al. | 370/277 |
| 2014/0146717 A1 * | 5/2014 | Mikhemar et al. | 370/278 |
| 2014/0146718 A1 * | 5/2014 | Mikhemar et al. | 370/278 |

* cited by examiner

*Primary Examiner* — Afsar M Qureshi
(74) *Attorney, Agent, or Firm* — McDermott Will & Emery LLP

(57) ABSTRACT

A circuit for a wideband electrical balance duplexer (EBD) may include a first impedance element and a second impedance coupled between a first and a second node and a second and a third node of the bridge circuit, respectively. An antenna may be coupled between the first and a fourth node of the bridge circuit to receive and transmit RF signals. A balancing network may provide an impedance substantially matching an impedance of the antenna. The balancing network may be coupled between the third and the fourth node of the bridge circuit. The first or the second impedance elements may facilitate balancing the bridge circuit. One or more output nodes of a transmit path may be coupled to an input node of the bridge circuit. One or more input nodes of a receive path may be coupled between the second and the fourth node of the bridge circuit.

20 Claims, 4 Drawing Sheets

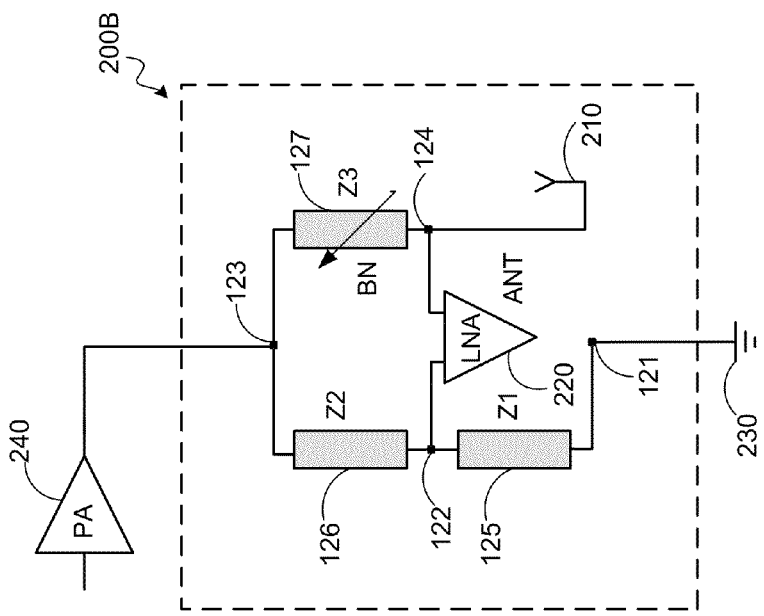
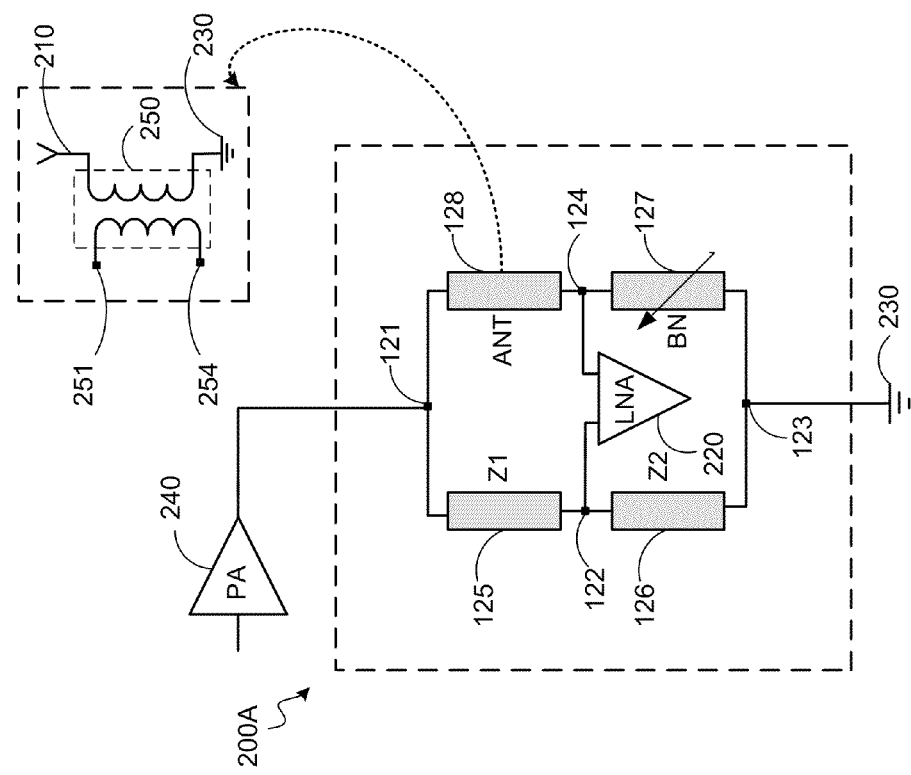
FIG. 2B
FIG. 2A

WIDE BAND ELECTRICAL BALANCE DUPLEXER WITH BALANCED BRIDGE CIRCUIT

TECHNICAL FIELD

The present description relates generally to radio frequency (RF) communications, and more particularly, but not exclusively, to a wideband electrical duplexer with balanced bridge circuit.

BACKGROUND

Many commercial cellular handsets require multi-band operation. Typically, a 2G/3G cellular transceiver may cover a number of 2G frequency bands (e.g., 850, 900, 1800, and 1900 MHz) and several 3G frequency bands (e.g., bands I, II, III). The existing multi-band approach may be inefficient in term of cost and area. The limitation of such multi-band approach may stem from the need for highly selective radio-frequency (RF) filters, such as SAW filters for 2G and duplexers for 3G operation. With the introduction of new technologies such as 4G and multiple antennas, and the demand to cover more frequency bands, the number of required RF filters and duplexers may increase to an impractical level, in terms of cost and area.

An optimal implementation of a multi-band transceiver may include an antenna-ready radio, completely integrated on a single CMOS chip. The single chip solution may have a performance advantage of saving on the RF switch and printed circuit board (PCB) loss. One of the missing pieces to realize the single CMOS chip antenna-ready radio is a wideband multi-band RF duplexer, for example, a wideband integrated RF duplexer supporting 3G/4G (e.g., supporting bands, such as bands I, II, III, IV, and IX). The RF duplexer may provide isolation in transmit (TX) band to avoid saturation of the receiver, and also to relax the linearity and phase noise requirement of the receive (RX) path. In a conventional duplexer, isolation is achieved using frequency-selective filters (e.g., surface acoustic wave (SAW) filters). However, SAW filters cannot be integrated on a silicon-based chip. Further, a SAW filter typically has a narrow bandwidth, as a result, a conventional duplexer operating in multiple frequency bands may require multiple SAW filters (e.g., one for each frequency band), increasing the size and cost of the RF board.

Therefore, the need exists for a low cost, small size, and wideband RF duplexer circuit.

BRIEF DESCRIPTION OF THE DRAWINGS

Certain features of the subject technology are set forth in the appended claims. However, for purpose of explanation, several embodiments of the subject technology are set forth in the following figures.

FIG. 2A illustrates an example wideband EBD using a balanced bridge circuit with transformer coupled antenna in accordance with one or more implementations.

FIG. 2B illustrates an example wideband EBD using a balanced bridge circuit with direct-coupled antenna in accordance with one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1A:
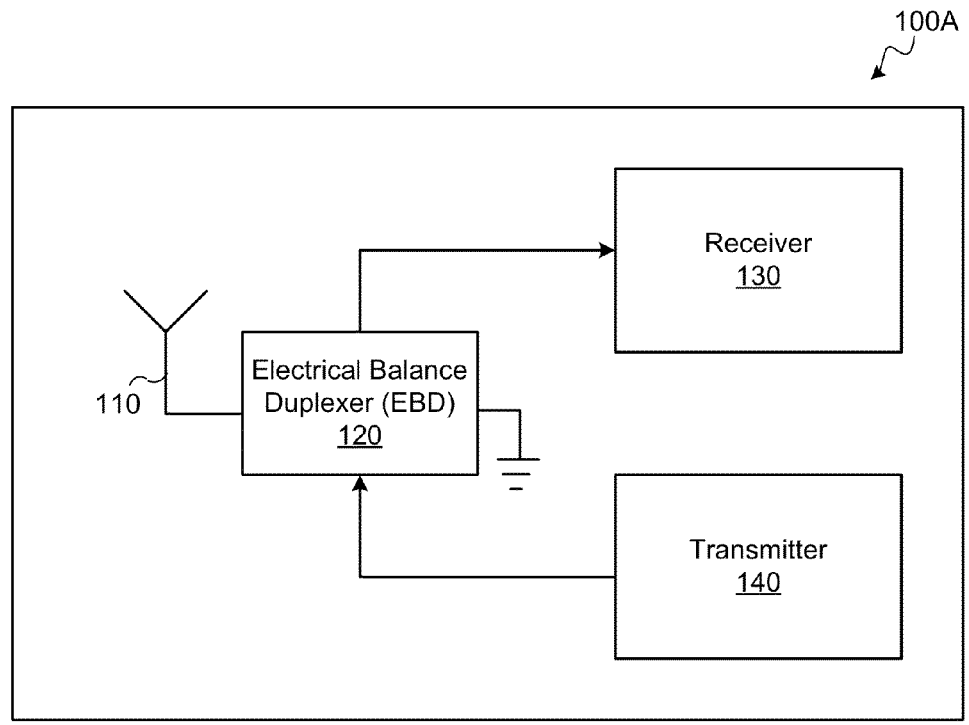
FIG. 1A illustrates an example RF transceiver using a wideband electrical balance duplexer (EBD) in accordance with one or more implementations.

FIG. 1A illustrates an example RF transceiver 100A using a wideband electrical balance duplexer (EBD) 120 in accordance with one or more implementations of the present invention. The RF transceiver 100A may include an antenna 110, a receiver 130, a transmitter 140, and an EBD duplexer 120. The RF signals received by the antenna 110 may reach the receiver 130 through the EBD 120. The RF signals transmitted by the antenna 110 may reach the antenna 110 from the transmitter 140 through the EBD 120.

Generally, the role of the RF duplexer in transceivers is to provide a specific isolation (e.g., 50 dB for 3G applications) in the transmit (TX) band, so that the large signals of the TX band are isolated from the receiver (e.g., the receiver 130). This is to avoid saturation of the receiver or damaging the low noise amplifier (LNA) of the receiver, and also to relax the linearity and phase noise requirement of the receiver. Furthermore, the RF duplexer may attenuate the noise in the RX band by approximately 45 dB to push the RX-band noise below the RX noise floor. The conventional RF duplexers are implemented as two very sharp RF SAW filters. Typical insertion loss of the RF SAW duplexers, for the TX and RX path, may be approximately 2 dB and 2.5 dB, respectively. The EBD duplexer 120 of the subject technology provides a wideband solution (e.g., with a bandwidth of approximately 200 MHz) that can be integrated with the receiver 130 and transmitter 140 on a single chip (e.g., silicon chip, such as CMOS chip).

Figure 1B:
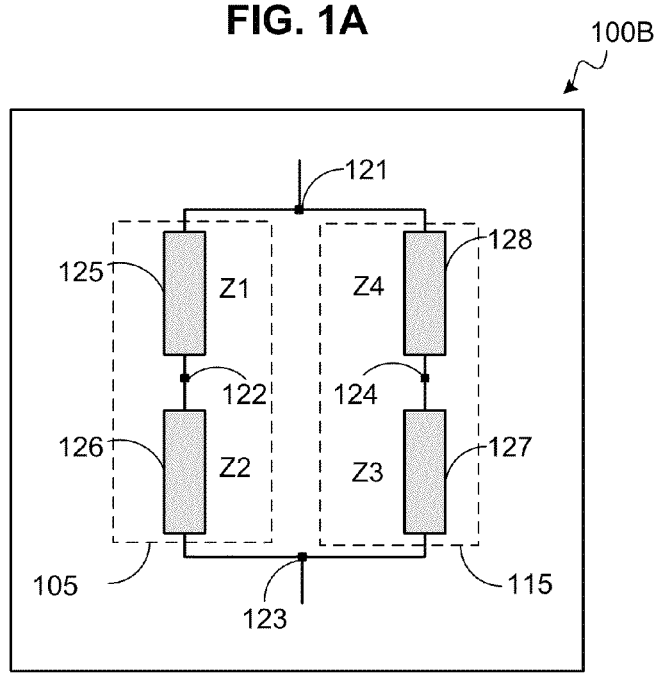
FIG. 1B illustrates an example balanced bridge circuit implementation of the wideband EBD of FIG. 1A in accordance with one or more implementations.

FIG. 1B illustrates an example balanced bridge circuit 100B implementation of the wideband EBD 120 of FIG. 1A in accordance with one or more implementations of the present invention. The balanced bridge circuit 100B includes a first and a second leg 105 and 115 and four nodes, a first node 121, a second node 122, a third node 123, and a fourth node 124. The bridge circuit 120 may be coupled at one end (e.g., the first node 121 or the third node 123) to one or more output nodes of a TX path (e.g., an output node of the transmitter 140 of FIG. 1A), and at the other end (e.g., the third node 123 or the first node 121) to ground potential. The first leg 105 may include an impedance element 125 with an impedance Z1 and an impedance element 126 with an impedance Z2. The second leg 115 may include an impedance element 127 with an impedance Z3 and an impedance element 128 with an impedance Z4. The second and fourth nodes 122 and 124 may be coupled to one or more input nodes of an RX path (e.g., input node of the receiver 130 of FIG. 1A).

The impedance elements 125 and 126 may include any passive element. In some implementations of the present invention, in order to reduce noise, impedance elements 125 and 126 may be limited to capacitors and inductors. For example both impedance elements 125 and 126 can be implemented using capacitors or inductors. In some implementations, where the antenna is a tuned antenna, each of the impedance elements 125 and 126 may include one or more capacitors and inductors. Each of the impedance elements 127 and 128 may represent impedances Z3 and Z4 associated with a balancing network of the EBD 120 of FIG. 1A and the antenna 110 FIG. 1A, respectively.

In order to isolate the input nodes of the RX path (e.g., nodes 122 and 124) from the output node of the TX path (e.g., node 121), the bridge circuit 100B can be balanced. In a balanced condition, the signals (e.g., voltage signals) at nodes 122 and 124 of the bridge circuit 100B may be substantially identical. In other words, in an ideal balanced condition, the differential signal between nodes 122 and 124 (e.g., leaking from the TX path to the RX path) may be approximately zero, which provides a desirable isolation between the output nodes of the TX path and the input nodes of the RX path. Further, the noise generated by the impedance (e.g., resistance) of the antenna is substantially suppressed at the input nodes of the RX path, which makes the balanced bridge circuit 100B a desirable wideband EBD circuit. It is known that the requirement for the bridge circuit 100B to be balanced is that the impedances Z1, Z2, Z3, and Z4 satisfy the following condition:

$$Z1/Z2 = Z4/Z3 \quad (1)$$

Where Z1/Z2 is the ratio of the impedances in the first leg 105 and Z4/Z3 is the ratio of the impedances in the second leg 115. The wideband characteristic of the bridge circuit 100B arises from the fact that the isolation between the output of the TX path (e.g., node 121) and the input nodes of the RX path (e.g., nodes 122 and 124) is substantially independent of frequency. This is because at the balanced condition (1), the differential signal between nodes 122 and 124 of the bridge circuit 100B is substantially zero, independent of frequency of operation. In other words, the frequency dependence of the impedances Z1, Z2, Z3, and Z4 may not affect the isolation between the TX and RX paths, as long as the bridge circuit 100B is balanced. In one or more implementation of the present invention, The impedance Z3 may be adjusted to match a measured impedance Z4 of the antenna 110 and the impedances Z1 and Z2 may be selected such that the condition (1) is satisfied.

FIG. 2A illustrates an example wideband EBD using a balanced bridge circuit 200A with transformer coupled antenna 210 in accordance with one or more implementations. The balanced bridge circuit 200A is similar to the bridge circuit 100B of FIG. 1B, except that the first node 121 is coupled to a power amplifier (PA) 240 (e.g., of transmitter 140 of FIG. 1A) and the second and fourth nodes 122 and 124 are coupled to input nodes of an LNA 220 (e.g., of receiver 130 of FIG. 1A). In the configuration of the balanced bridge circuit 200A, the impedance element 127 may represent the impedance of a balancing network and the impedance element 128 may represent an impedance of an antenna 210. The antenna 210 may be coupled to the balanced bridge circuit 200A through a transformer 250, by connecting nodes 251 and 254 of a secondary winding of the transformer 250 to nodes 121 and 124 of the balanced bridge circuit 200A, respectively. The nodes of the primary winding of the transformer 250 may be connected to antenna 210 and ground potential 230 as shown. The equivalent impedance of the antenna 210, as seen from nodes 251 and 254, (e.g., impedance Z4 of impedance element 128) may be the same or proportional to a measured impedance of the antenna 210, depending on the turn ratio of the transformer 250. The impedance Z3 of the balancing network (BN) may be adjusted according to the value Z4 of the equivalent impedance of the antenna 210.

FIG. 2B illustrates an example wideband EBD using a balanced bridge circuit 200B with direct-coupled antenna 210 in accordance with one or more implementations of the current invention. The balanced bridge circuit 200B is similar to the bridge circuit 100B of FIG. 1B, except that the third node 123 is coupled to a power amplifier (PA) 240 (e.g., of transmitter 140 of FIG. 1A) and the second and fourth nodes 122 and 124 are coupled to input nodes of an LNA 220 (e.g., of receiver 130 of FIG. 1A). In the configuration of the balanced bridge circuit 200B, the impedance element 127 may represent the impedance of a balancing network. The antenna 210 may be directly coupled to the balanced bridge circuit 200B. The equivalent impedance of the antenna 210, as seen from the node 124 (e.g., impedance Z4 of impedance element 128 of FIG. 1B), may be the same as a measured impedance of the antenna 210. The impedance Z3 of the balancing network (BN) may be adjusted according to the value Z4 of the equivalent impedance of the antenna 210. As discussed above with respect to FIG. 1B, for the balanced bridge circuit 200B, the balancing condition Z1/Z2=Z4/Z3 holds, thus the impedances Z1 and Z2 may be selected accordingly.

Figure 2C:
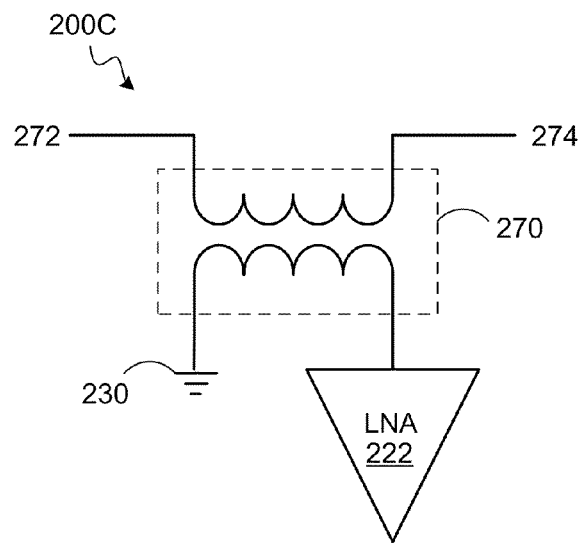
FIG. 2C illustrates an example coupling of a single-ended low-noise amplifier (LNA) to the balanced bridge circuit of FIGS. 2A and 2B in accordance with one or more implementations.

FIG. 2C illustrates an example coupling of a single-ended LNA 222 to balanced bridge circuit 200A of FIG. 2A or balanced bridge circuit 200B of FIG. 2B in accordance with one or more implementations of the current invention. The wide band EBD circuits shown in FIGS. 2A and 2B may also be applicable when the LNA is a single-ended LNA, as shown in FIG. 2C. The single-ended LNA 222 may be coupled to the nodes 122 and 124 of the balanced bridge circuits 200A or 200B via a transformer 270. The nodes of the primary winding of transformer 270 may be connected to an input node of the LNA 222 and ground potential 230, respectively. The nodes 272 and 274 of the secondary winding of the transformer 270 may be connected, respectively, to the nodes 122 and 124 of the balanced bridge circuits 200A or 200B. In the balanced condition of these bridge circuits, the voltages at nodes 272 (when connected to node 122 of FIG. 2A or 2B) and 274 (when connected to node 124 of FIG. 2A or 2B) may be substantially the same, thus the voltage at the input of the LNA 222 may be substantially the same as the ground potential (e.g., zero).

In other words, in the balanced condition of the balanced bridge circuits 200A or 200B, signals from the PA 240 of FIG. 2A or 2B or noise signals from the antenna 210 FIG. 2A or 2B may not reach the input of the LNA 222. Therefore, the balanced bridge circuits 200A or 200B may provide a desirable isolation between the output of the PA 240 and the LNA 222 and substantially suppress any noise generated by the impedance of the antenna 210 at the input nodes of the LNA 222. These are desirable features of a wideband RF duplexer, as discussed above.

Figure 2D:
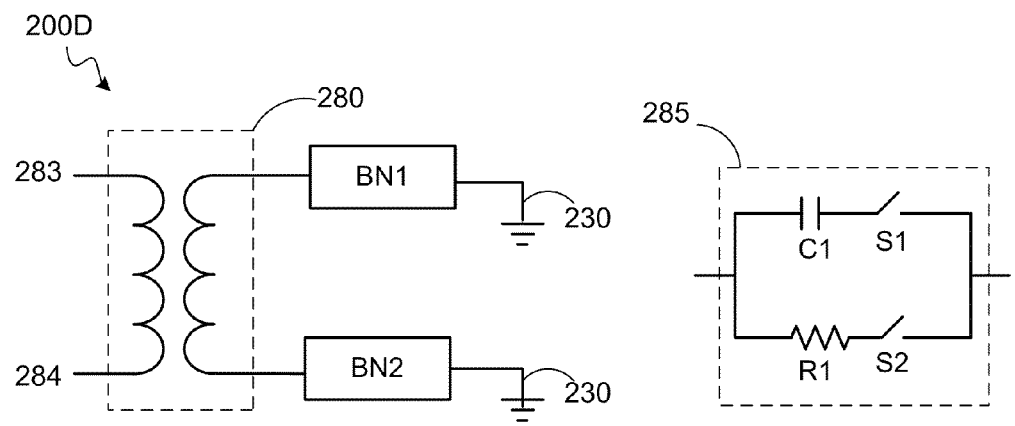
FIG. 2D illustrates an example balancing network for coupling to the balanced bridge circuit of FIG. 2B in accordance with one or more implementations.

FIG. 2D illustrates an example balancing network 200D for coupling to the balanced bridge circuits of FIGS. 2A and 2B in accordance with one or more implementations of the present invention. The balancing network 200D includes impedance blocks BN1 and BN2 that can be coupled to the balanced bridge circuits of FIGS. 2A and 2B via a transformer 280, where the nodes 283 and 284 of a secondary winding of the transformer 280 may be connected, respectively, to nodes 123 and 124 of the balanced bridge circuits of FIGS. 2A and 2B. In one or more implementations, the balancing network 200D may include more than two impedance blocks. Each impedance block (e.g., 285) may include a number of parallel branches (e.g., two branches), where each branch may include a passive element (e.g., a resistor, such as R1 or a capacitor, such as C1), each coupled to ground potential (e.g., 230) through a switch (e.g., switches S1 or S2, such as MOS switches). The equivalent impedance Z3 of the balancing network, seen through nodes 283 and 284 of the transformer 280 may depend on the impedances of the impedance block (e.g., BN1 and BN2) and a turn ratio of the transformer 280. The switches may be controlled via control signals that may adjust the impedance Z3 by adding or removing one or more of the passive elements of the impedance blocks.

Figure 3:
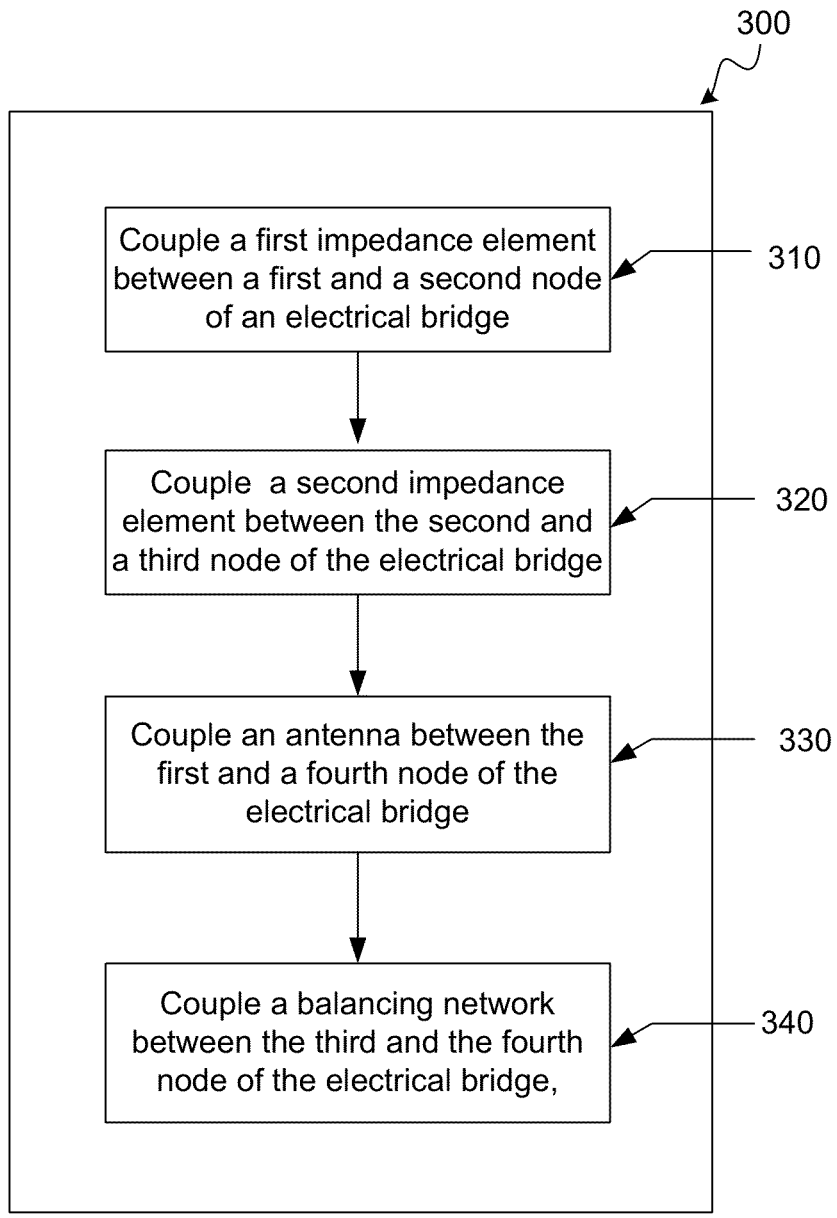
FIG. 3 illustrates an example method for providing a wideband EBD using a balanced bridge circuit in accordance with one or more implementations.

FIG. 3 illustrates an example method for providing a wideband EBD (e.g., EBD 120 of FIG. 1A) using a balanced bridge circuit in accordance with one or more implementations of the present invention. For explanatory purposes, the example method 300 is described herein with reference to the balanced bridge circuits 100B of FIG. 1B, 200A of FIG. 2A, or 200B of FIG. 2B; however, the example method 300 is not limited to the balanced bridge circuits 100B, 200A, and 200B. Further for explanatory purposes, the blocks of the example method 300 are described herein as occurring in serial, or linearly. However, multiple blocks of the example method 300 may occur in parallel. In addition, the blocks of the example method 300 need not be performed in the order shown and/or one or more of the blocks of the example method 300 need not be performed.

At operation block 310, a first impedance (e.g., 125 of FIG. 1B, 2A, or 2B) may be coupled between a first node (e.g., 121 of FIG. 1B, 2A, or 2B) and a second node (e.g., 122 of FIG. 1B, 2A, or 2B) of a bridge circuits (e.g., 100B, 200A, or 200B, respectively, of FIG. 1B, 2A, or 2B). At operation block 320, a second impedance (e.g., 126 of FIG. 1B, 2A, or 2B) may be coupled between the second node 122 and a third node (e.g., nodes 123 of FIG. 1B, 2A, or 2B) of the bridge circuit. An antenna (e.g., 110 of FIG. 1A or 210 of FIG. 2A, or 2B) may be coupled, at operation block 330, between the first node 121 and a fourth node (e.g., 124 of FIG. 1B, 2A, or 2B) of the bridge circuit. The antenna may be configured to transmit RF signals generated by the transmitter 140 of FIG. 1A and receive RF signals to be delivered to the receiver 130 of FIG. 1A via the wide band duplexer 100B. At operation block 340, a balancing network (e.g., 127 of FIG. 1B, 2A, or 2B or 200D of FIG. 2D) may be coupled between the third node 123 and the fourth nodes 124.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a wideband electrical balance duplexer (EBD), the circuit comprising:
 a first impedance element coupled between a first and a second node of a bridge circuit;
 a second impedance element coupled between the second and a third node of the bridge circuit;
 an antenna configured to receive and transmit RF signals, the antenna being coupled between the first and a fourth node of the bridge circuit; and
 a balancing network configured to provide an impedance that substantially matches an impedance of the antenna, the balancing network being coupled between the third and the fourth node of the bridge circuit, wherein
 a) at least one of the first or the second impedance elements are configured to facilitate balancing the bridge circuit,
 b) one or more output nodes of a transmit (TX) path are coupled to an input node of the bridge circuit, and
 c) one or more input nodes of a receive (RX) path are coupled between the second and the fourth node of the bridge circuit.

2. The circuit of claim 1, wherein:
 a) balancing the bridge circuit comprises providing substantially identical signals at the second and the fourth node of the bridge circuit,
 b) the identical signals comprise at least one of a voltage or a current signal,
 c) the input nodes of the RX path comprises one or more input nodes of at least one low noise amplifier (LNA) of an RF transceiver, and
 d) the LNA comprises a differential LNA.

3. The circuit of claim 2, wherein the LNA is a single-ended LNA that is coupled to the balanced bridge circuit via a transformer.

4. The circuit of claim 1, wherein:
 a) the one or more output nodes of the TX path comprise one or more output nodes of at least one power amplifier (PA) of an RF transceiver,
 b) the input node of the bridge circuit comprises the first node, and
 c) the third node of the bridge circuit is coupled to ground potential.

5. The circuit of claim 4, wherein the antenna is coupled to the bridge circuit using a transformer.

6. The circuit of claim 1, wherein
 a) the input node of the bridge circuit comprises the third node, and
 b) the first node of the bridge circuit is coupled to ground potential.

7. The circuit of claim 6, wherein the antenna is configured to provide a voltage signal between the first node and the fourth node of the bridge circuit.

8. The circuit of claim 1, wherein the bridge circuit is configured to isolate the one or more output nodes of the TX path from the one or more input nodes of the RX path, and wherein the bridge circuit is configured to substantially reduce a noise signal generated by an impedance associated with the antenna at the one or more input nodes of the RX path.

9. The circuit of claim 1, wherein:
 a) the balancing network comprises a plurality of passive elements, each selectable via a switch,
 b) the plurality of passive elements comprise capacitors and resistors, and
 c) the switch comprises a MOS switch.

10. A method of providing a wideband electrical balance duplexer (EBD), the method comprising:
 coupling a first impedance element between a first and a second node of a bridge circuit;
 coupling a second impedance element between the second and a third node of the bridge circuit;
 coupling an antenna between the first and a fourth node of the bridge circuit, the antenna being configured to transmit and receive RF signals; and
 coupling a balancing network between the third and the fourth node of the bridge circuit, the balancing network being configured to provide an impedance that substantially matches an impedance of the antenna, wherein
 a) at least one of the first or the second impedance elements are configured to facilitate balancing the bridge circuit,
 b) one or more output nodes of a transmit (TX) path are coupled to an input node of the bridge circuit, and
 c) one or more input nodes of a receive (RX) path are coupled between the second and the fourth node of the bridge circuit.

11. The method of claim 10, wherein:
 a) balancing the bridge circuit comprises providing substantially identical signals at the second and the fourth node of the bridge circuit,
 b) the identical signals comprise at least one of a voltage or a current signal,
 c) the input nodes of the RX path comprises one or more input nodes of at least one low noise amplifier (LNA) of an RF transceiver, and
 d) the LNA comprises a differential LNA.

12. The method of claim 11, wherein the LNA is a single-ended LNA that is coupled to the balanced bridge circuit via a transformer.

13. The method of claim 10, wherein:
 a) the one or more output nodes of the TX path comprise one or more output nodes of at least one power amplifier (PA) of the an RF transceiver,
 b) the input node of the bridge circuit comprises the first node, and
 c) the third node of the bridge circuit is coupled to ground potential.

14. The method of claim 13, wherein coupling the antenna between the first and the fourth node of the bridge circuit comprises coupling the antenna to the bridge circuit by using a transformer.

15. The method of claim 10, wherein
 a) the input node of the bridge circuit comprises the third node, and
 b) the first node of the bridge circuit is coupled to ground potential.

16. The method of claim 15, wherein the antenna is configured to provide a voltage signal between the first node and the fourth node of the bridge circuit.

17. The method of claim 10, further comprising configuring the bridge circuit to isolate the one or more output nodes of the TX path from the one or more input nodes of the RX path, and wherein the bridge circuit is configured to substantially reduce a noise signal generated by an impedance associated with the antenna at the one or more input nodes of the RX path.

18. The method of claim 10, wherein:
 a) coupling the balancing network between the third and the fourth node of the bridge circuit comprises coupling a plurality of passive elements between the third and the fourth node of the bridge circuit, each passive element being selectable via a switch,
b) the plurality of passive elements comprise capacitors and resistors, and
c) the switch comprises a MOS switch.

19. A transceiver, comprising:
an antenna configured to transmit and receive RF signals; and
a wideband electrical balance duplexer (EBD) circuit configured to isolate one or more output nodes of a TX path of the transceiver from one or more input nodes of an RX path of the transceiver, the wideband electrical balance duplexer comprising:
  a first impedance element coupled between a first and a second node of a bridge circuit;
  a second impedance element coupled between the second and a third node of the bridge circuit; and
  a balancing network configured to provide an impedance that substantially matches an impedance of the antenna, the balancing network being coupled between the third and a fourth node of the bridge circuit, wherein
  a) the antenna is coupled between the first and the fourth node of the bridge circuit,
  b) at least one of the first or the second impedance elements are configured to facilitate balancing the bridge circuit,
  c) one or more output nodes of the TX path is coupled to an input node of the bridge circuit, and
  d) one or more input nodes of the RX path are coupled between the second and the fourth node of the bridge circuit.

20. The transceiver of claim 19, wherein,
a) balancing the bridge circuit comprises providing substantially identical signals at the second and the fourth node of the bridge circuit,
b) the identical signals comprise at least one of a voltage or a current signal,
c) the input nodes of the RX path comprises one or more input nodes of at least one low noise amplifier (LNA), including a differential LNA,
d) the one or more output nodes of the TX path comprise one or more output nodes of at least one power amplifier (PA), and
e) the bridge circuit is configured to substantially reduce a noise signal generated by an impedance associated with the antenna at the one or more input nodes of the RX path.

\* \* \* \* \*